United States Patent
Tabara

Patent Number: 5,639,341
Date of Patent: Jun. 17, 1997

[54] DRY ETCHING WITH LESS PARTICLES

[75] Inventor: Suguru Tabara, Hamamatsu, Japan

[73] Assignee: Yamaha Corporation, Japan

[21] Appl. No.: 594,282

[22] Filed: Jan. 30, 1996

[30] Foreign Application Priority Data

Feb. 1, 1995 [JP] Japan ................. 7-035935

[51] Int. Cl.$^6$ .............. H01L 21/00; C23C 14/00; C23F 4/00
[52] U.S. Cl. .............. 156/643.1; 156/345; 156/646.1; 216/69; 204/298.37; 204/298.38; 118/723 MW; 118/723 MA; 134/1.1
[58] Field of Search .............. 156/643.1, 646.1, 156/345; 216/67, 69, 70; 204/192.37, 298.31, 298.38

[56] References Cited

U.S. PATENT DOCUMENTS

| | | | |
|---|---|---|---|
| 5,143,866 | 9/1992 | Matsutani | 437/187 |
| 5,211,825 | 5/1993 | Saito et al. | 204/192.32 |
| 5,482,612 | 1/1996 | Armstrong et al. | 204/298.11 |
| 5,514,246 | 5/1996 | Blalock | 156/643.1 |

FOREIGN PATENT DOCUMENTS

3-29324 2/1991 Japan.

*Primary Examiner*—R. Bruce Breneman
*Assistant Examiner*—Michael E. Adjodha
*Attorney, Agent, or Firm*—Ostrolenk, Faber, Gerb & Soffen, LLP

[57] ABSTRACT

Sticking layer forming material is provided so as to be exposed to plasma, partially on an anti-deposition plate mounted on the inner wall of a process chamber of an ECR (or microwave) plasma etching system. The sticking layer forming material is refractory metal such as W or refractory metal silicide. After a wafer with a photoresist layer is set on a susceptor, a plasma process (aging process) is performed to form a sticking layer of low hardness on the inner wall of the process chamber, the sticking layer containing $WCl_5$, $WCl_6$, etc. and resist components. This sticking layer prevents Si oxyhalide from being scaled off the inner wall of the process chamber during the etching process of Si-containing material after the aging process. The sticking layer forming material may be provided on a wafer and the resist components may be supplied from gas. In this manner, particles are reduced which are otherwise generated more while Si-containing material such as silicide is etched.

26 Claims, 5 Drawing Sheets

DRY ETCHING WITH LESS PARTICLES

BACKGROUND OF THE INVENTION a) Field of the Invention

The present invention relates to dry etching of Si (silicon)-containing material suitable for manufacture of LSIs or other semiconductor devices, and more particularly to a dry etching method and system capable of reducing particles.

b) Description of the Related Art

Figure 3:
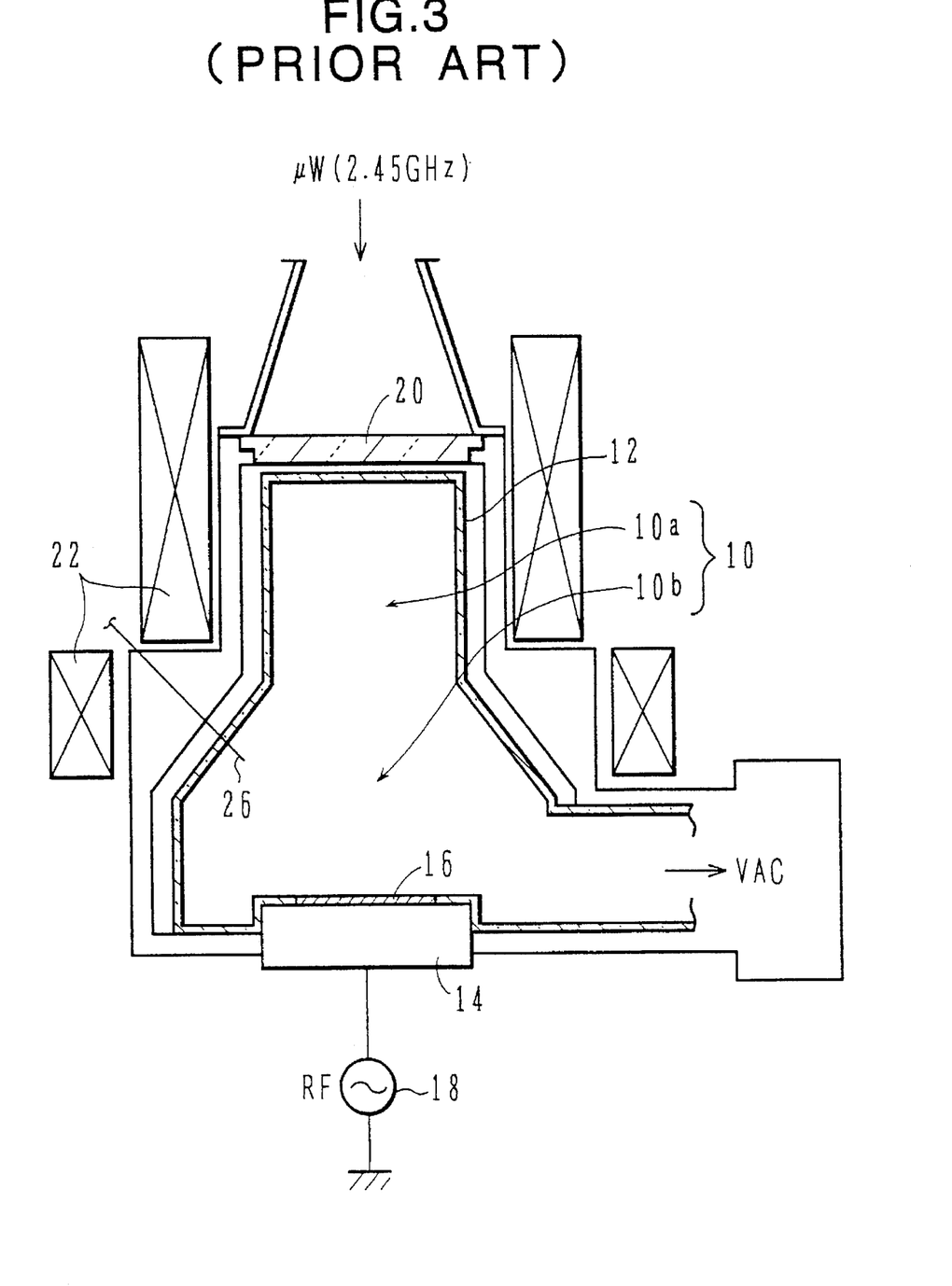
FIG. 3 is a cross sectional view of a conventional ECR plasma etching system.
Figure 4:
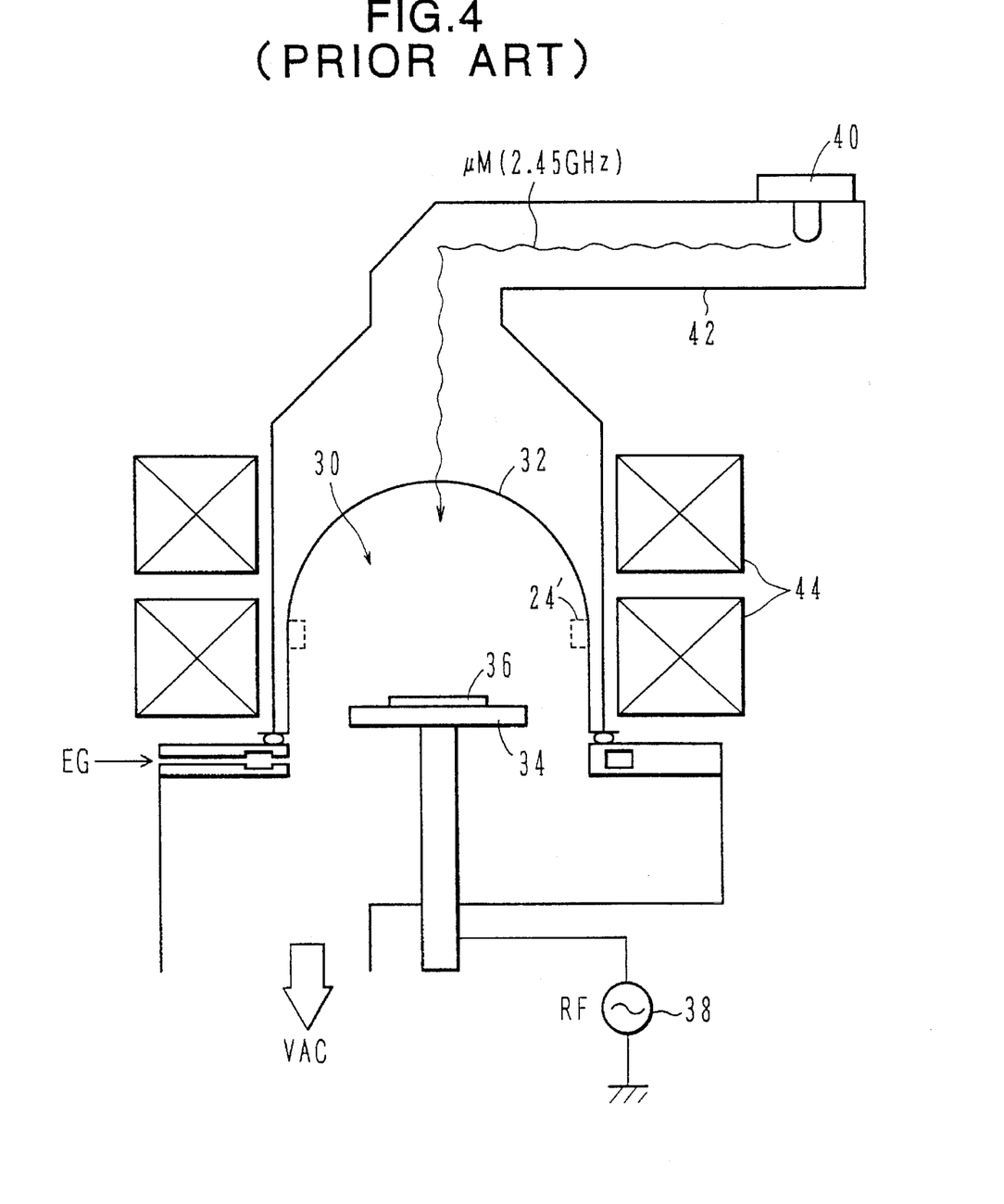
FIG. 4 is a cross sectional view of a conventional microwave plasma etching system.

An ECR (electron cyclotron resonance) plasma etching system such as shown in FIG. 3, a microwave plasma etching system such as shown in FIG. 4, and other systems are known as conventional means for dry etching Si-containing material.

In the etching system shown in FIG. 3, a process chamber 10 defines a reaction chamber 10b and a plasma chamber 10a. An anti-deposition plate 12 usually made of quartz is mounted on the inner wall of the process chamber 10.

A susceptor (electrode) 14 is disposed at the bottom of the reaction chamber 10b, for placing thereon a wafer 16. A high frequency power source 18 is connected to the susceptor 14 to supply a high frequency power of, for example, 13.56 MHz. The reaction chamber 10b is coupled via a pipe 26 to an unrepresented gas supply source, and connected at its bottom side to an unrepresented vacuum pump VAC.

To the upper space of the reaction chamber 10a, a microwave μW of, for example, 2.45 GHz, is supplied from a microwave source not show in the drawing via a microwave guide window 20 usually made of quartz. A solenoid coil 22 is disposed surrounding the upper portion of the process chamber 10 for applying a magnetic field in the process chamber 10.

In the etching system shown in FIG. 4, etching gas EG is supplied to a process chamber 30 confined in a vessel 32 made of quartz or a different kind of material, the bottom of the chamber 30 being connected to an unrepresented vacuum pump VAC.

A susceptor (electrode) 34 is disposed in the process chamber 30, for placing thereon a wafer 36. A high frequency power of, for example, 2 MHz, is supplied from a high frequency power source 38 to the susceptor 34 to generate a bias electric field.

A microwave of, for example, 2.45 GHz, is supplied from a magnetron 40 via a waveguide 42 to the upper space of the process chamber 30. A solenoid coil 44 is disposed surrounding the upper portion of the process chamber 30 for establishing a magnetic field in the process chamber 30.

Silicon oxyhalide ($SiO_xX_y$, where X is Cl, or Br) by-products are generated while Si-containing material is etched by plasma of mixed gas in the dry etching systems shown in FIGS. 3 and 4. The Si-containing material may be monocrystalline Si, polycrystalline Si, amorphous Si, refractory metal silicide ($WSi_2$, $MoSi_2$, $TiSi_2$, $TaSi_2$), or other materials, and the mixed gas is a mixture of oxygen gas and halogen (Cl, Br) containing gas, such as $Cl_2/O_2$, $HBr/O_2$, $HCl/O_2$). $O_2$ gas is mixed in order to form an anisotropic pattern shape and improve an etching selection ratio of $SiO_2$. Si oxyhalide serves to protect a pattern side wall and form an anisotropic pattern shape.

Si oxyhalide is also attached to the inner wall of the process chamber and generates particles in the following mechanism. Although the inner wall of the process chamber is heated by microwave during etching, it is not heated while microwave is not supplied (such as when a wafer is placed in or taken out of the process chamber). Therefore, it undergoes a temperature cycle during the supply and stop of microwave. Si oxyhalide attached to the inner wall of the process chamber during etching is peeled off from the inner wall of the process chamber when the temperature of the process chamber lowers, because of a thermal expansion coefficient difference between the inner wall and Si oxyhalide, and generates particles which drop onto the wafer and contaminate it.

Wafer contamination by particles results in a low product yield. In view of this, etching Si-containing material starts generally after the process chamber is subjected to a cleaning process. The cleaning process includes wet cleaning and dry (or plasma) cleaning. Normally, after wet cleaning is performed, dry (or plasma) cleaning is performed. This dry (or plasma) cleaning is also called aging. With this aging, a wafer (e.g., a bare wafer without pattern) prepared for aging only is plasma-etched under the same conditions as etching a product wafer in order to obtain the same atmosphere as etching the product wafer and stabilize the following actual process of etching the product wafer.

The following three methods (a) to (c) have been proposed for such aging:

(a) an Si bare wafer is used as an aging wafer, and etched by plasma of mixed gas of $O_2$ gas and Cl- or Br-containing gas;

(b) an Si wafer with a photoresist layer is used as an aging wafer, and etched by plasma of mixed gas of $O_2$ gas and Cl- or Br-containing gas; and (c) an Si wafer with a refractory metal silicide layer such as $WSi_2$ and a photoresist layer formed in this order is used as an aging wafer, and etched by plasma of mixed gas of $O_2$ gas and Cl- or Br-containing gas.

With the above methods (a) and (b), Si oxyhalide by-products are attached to the inner wall of a process chamber and generate particles in the way of the above-described mechanism.

With the above method (c), not only Si oxyhalide by-products are generated, but refractory metal halide or oxyhalide by-products are also generated when refractory metal silicide is etched. This method also poses the problem of particles as in the methods (a) and (b).

These conventional aging methods all have the possibility of generating particles.

As a conventional method of preventing particles from being scaled off an anti-deposition plate in a process chamber of a dry etching system or film forming system, it is known to cover a film attached to the anti-deposition plate with a protect layer which is good in adhesion with the attached film (e.g., Japanese Patent Laid-open Publication No. 3-29324).

Even with this particle preventing method, it is difficult to refrain from the generation of particles of Si oxyhalide by-products dropped from the inner wall of the process chamber, when Si-containing material is etched by plasma of mixed gas of $O_2$ gas and halogen (Cl, Br)-containing gas. Namely, even if a protect film good in adhesion with the Si oxyhalide film is formed, it is difficult to prevent the Si oxyhalide film from being flaked during the Si-containing material etching process.

SUMMARY OF THE INVENTION

It is an object of the present invention to provide a novel dry etching method capable of reducing particles.

It is another object of the present invention to provide a novel dry etching system capable of reducing particles.

According to one aspect of the present invention, there is provided a dry etching method comprising the steps of: performing an aging process with an aging wafer including a silicon-containing material by plasma of an aging gas not containing oxygen in a process chamber, thereby forming a sticking layer on an inner wall of the process chamber, the sticking layer having a hardness lower than the material of the inner wall and silicon oxyhalide; and thereafter performing an etching process on another wafer including a silicon-containing material by plasma of an etching gas containing halogen and oxygen in the process chamber.

According to another aspect of the invention, there is provided a dry etching method comprising the steps of performing an aging process by plasma in a process chamber, the process forming a sticking layer on the inner wall thereof, and the sticking layer having a hardness lower than the material of the inner wall and silicon oxyhalide; and thereafter performing an etching process by plasma in the process chamber for silicon-containing material.

In forming a sticking layer, a wafer such as a Si wafer is set in a process chamber, the wafer having on the surface thereof a deposited layer of refractory metal, its compound, or aluminum and a resist pattern formed on the deposited layer. An etching process is then performed by plasma of mainly halogen-containing gas not containing oxygen. The refractory metal may be W, Mo, Ta, or Nb. The halogen (Cl, Br)-containing gas may be one or a combination of $Cl_2$, $Br_2$, HCl, $BCl_3$, HBr, and $BBr3$. The sticking layer formed contains halide (e.g., $WCl_5$, $WCl_6$) of the etched material and the resist compositions.

In the process of forming the sticking layer, instead of forming a resist pattern on a wafer, material having functions like the resist may be supplied in gas phase. To this end, carbon-containing gas may be added to halogen-containing gas, or gas containing both halogen and carbon may be used.

Because the sticking layer of low hardness is formed on the inner wall of the process chamber during the aging process, Si oxyhalide is adhered to the sticking layer on the inner wall while Si-containing material is etched. The sticking layer has a hardness lower than the material of the inner wall of the process chamber and Si oxyhalide, so that it functions as a buffer layer for absorbing expansion and contraction of the process chamber inner wall and oxyhalide to be caused by a temperature cycle. It is therefore possible to suppress the Si oxyhalide from being scaled off the process chamber inner wall even under the temperature cycle. Particles can be reduced so that the manufacture yield is improved and the cleaning cycle can be prolonged.

According to another aspect of the present invention, there is provided a dry etching system comprising: a process chamber provided with a sticking layer forming material at least partially on the inner wall thereof for forming a sticking layer by plasma, the sticking layer having a hardness lower than the material of the inner wall and silicon oxyhalide, and the process chamber being used for etching silicon-containing material by plasma.

Since the sticking layer forming material is provided at least partially on the inner wall of the process chamber, the sticking layer of low hardness can be formed on the inner wall even during the etching process as well as the aging process. It is therefore possible to suppress the scale-off of Si oxyhalide and reduce particles. It is not necessary for this etching system to provide the sticking layer forming material on a wafer so that the aging process can be performed in a simple manner.

The above and other objects, features, and advantages of the invention will become more apparent from the following description of preferred embodiments when read in conjunction with the accompanying drawings.

DETAILED DESCRIPTION OF THE PREFERRED EMBODIMENTS

In order to help understand the present invention, analyses of conventional techniques made by the present inventor will first be described.

Figure 5:
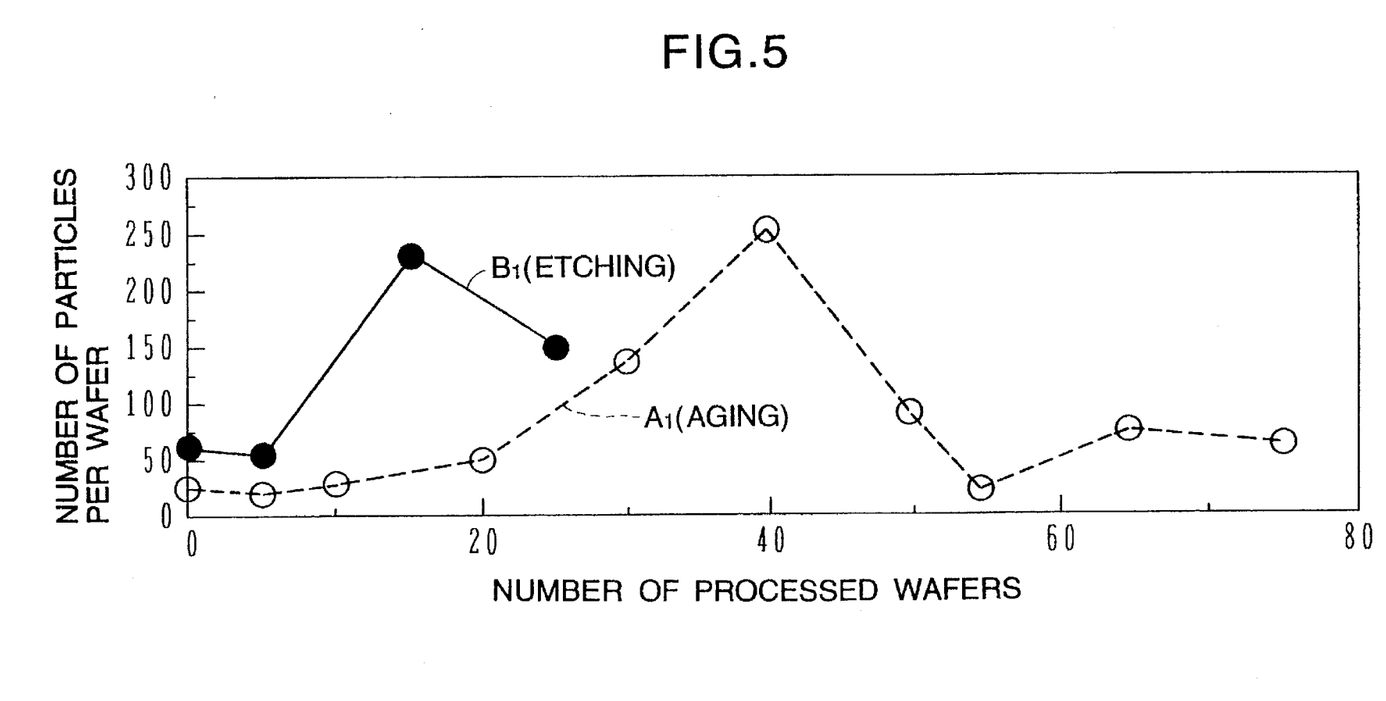
FIG. 5 is a graph showing the relationship between the numbers of processed wafers and particles when again and etching are performed by using the system shown in FIG. 3.

FIG. 5 shows the results of measurement by the above-described method (c). The abscissa represents the number of processed wafers and the ordinate represents the number of particles per wafer. Wafers were processed by aging and etching in the same chamber without breaking the vacuum.

Aging wafers used were Si wafers of 150 mm diameter, each having a $WSi_2$ layer deposited to a thickness of 250 nm and a photoresist layer formed thereon and patterned by known photolithography technique. These aging wafers were subjected to aging by plasma of $Cl_2/O_2$ gas. As each aging wafer was exposed to plasma, the wafer temperature was raised from the room temperature. After an aging process has done for an aging wafer, the aging wafer is eliminated from a process chamber and a sample wafer for observing particles is moved into the process chamber. The sample wafer is a silicon wafer having no pattern. Then, particles which appear on the sample wafer are counted. This counting step is performed under same gas flow rates and pressures for aging process and without making plasma ambient. Upon completion of the counting step, the sample wafer is replaced with a next aging wafer. These processes are conducted repeatedly for plural aging wafers and sample wafers for observing particles without breaking the vacuum condition. Plots $A_1$ shown in FIG. 5 indicate a change in the number of particles when aging wafers are successively subjected to aging as described before. The system was of a single wafer processing type, and wafers were processed one after another by transferring each wafer from a chamber which stores a plurality of wafers. The abscissa represents the cumulative number of processed wafers.

After the aging, the system was cooled without breaking the vacuum conditions. After the temperature was lowered to the room temperature (after about a half day), etching wafers were etched by plasma of $Cl_2/O_2$ gas. After an etching process has done for an etching wafer, the etching wafer is eliminated from a process chamber and a sample wafer for observing particles is moved into the process chamber. The sample wafer is a silicon wafer having no pattern. Then, particles which appear on the sample wafer are counted. This counting step is performed under same gas flow rates and pressures for aging process and without making plasma ambient. Upon completion of the counting step, the sample wafer is replaced with a next etching wafer.

These processes are conducted repeatedly for plural etching wafers and sample wafers for observing particles without breaking the vacuum condition. Plots $B_1$ shown in FIG. 5 indicate a change in the number of particles during these successive etching steps.

For the aging and etching, an ECR plasma etching system having the structure shown in FIG. 3 (for example, OZ3000 system manufactured by Sumitomo Metal Industries, Ltd.) was used to perform a plasma process under the conditions shown in Table 1.

TABLE 1

| $Cl_2/O_2$ Flow Rate | 25/9 sccm |
| --- | --- |
| Gas Pressure | 2 mTorr |
| RF Power | 45 W |
| Microwave Power | 1400 W |
| Coolant Temp. for Susceptor | 15° C. |
| Process Time | 80 sec |

Of the process time 80 seconds, 60 seconds were used for etching $WSi_2$ and 20 seconds were used for etching Si.

The number of particles having an area larger than 0.06 $\mu m^2$ was measured on the surface of each Si wafer, by using Surfscan 3000 manufactured by Tencor Instruments Inc., Calif., USA.

As seen from FIG. 5, although the number of particles reduces once by the aging, it increases again at the etching process after the process chamber was cooled.

The dry etching method according to an embodiment of this invention will be described.

Aging wafers used were Si wafers like those used for the measurements given in FIG. 5, each having a $WSi_2$ layer and a photoresist layer formed thereon, and the ECR plasma etching system shown in FIG. 3 was used. Aging was performed under the same conditions shown in Table 1, except $Cl_2$ gas plasma (with zero $O_2$ flow rate) was used as process gas. A dependency of the number of particles upon the number of processed wafers was checked in the manner described with FIG. 5. The results are indicated by plots A2 shown in FIG. 2.

After the aging, wafers having similar structure as the aging wafers were etched under the same conditions by plasma of $Cl_2/O_2$ mixture (see Table 1). The dependency of the number of particles upon the number of processed wafers was checked in the manner described with FIG. 5. The results are indicated by plots $B_2$ shown in FIG. 2.

Figure 2:
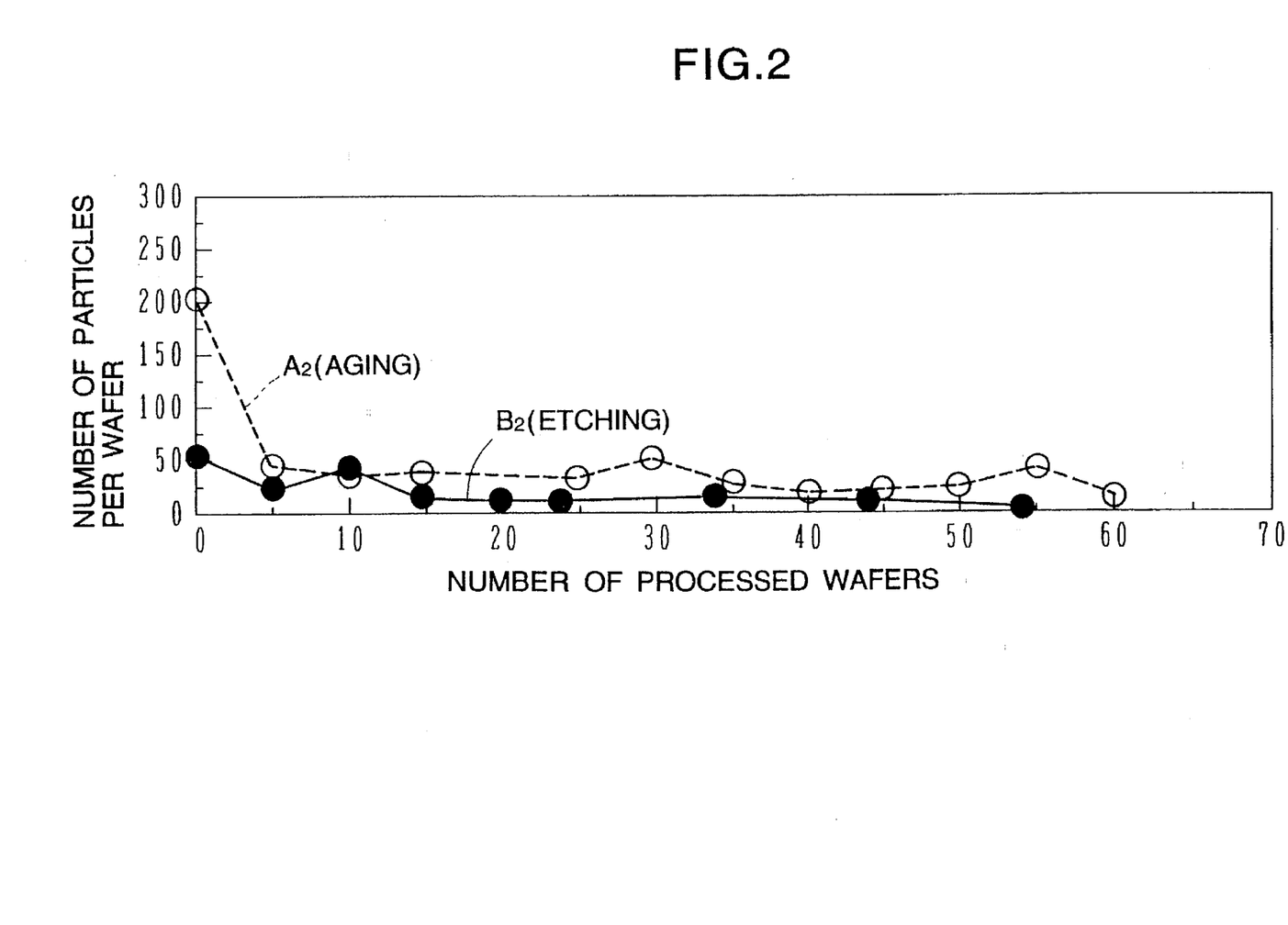
FIG. 2 is a graph illustrating the relationship between the numbers of processed wafers and particles, when aging and etching are performed by using the system shown in FIG. 1.

As seen from the comparison between the graphs shown in FIGS. 2 and 5, the number of particles after the process chamber was cooled is smaller in the graph of FIG. 2 of this embodiment than the graph of FIG. 5. This reduced number of particles can be ascribed to a layer of W chloride ($WCl_5$, $WCl_6$) attached to the inner wall of the process chamber, the W chloride being by-products of the aging process formed through reaction between the $WSi_2$ layer and $Cl_2$ gas plasma.

Generally, chloride has a hardness and melting point lower than oxide (or oxynitride) of the same compound material. It can therefore be considered that if chloride is used instead of oxide, a stress to be caused by a difference between thermal expansion coefficients is likely to be absorbed.

Even a gas supply system in a conventional aging process produces W chloride (WCl5, WCl6). However, its aging gas ($Cl_2+O_2$) contains $O_2$ so that the dominant material attached to the inner wall of the process chamber can be considered to be $SiCl_xO_y$ which is produced through reaction of $WSi_2$ of the aging wafer with oxygen and chlorine. This $SiCl_xO_y$ material having a high hardness is considered to scale off the inner wall (quartz) of the process chamber and produce particles while the wall expands and contracts because of the thermal hysteresis before and after aging.

However, in this embodiment, material attached to the inner wall of the process chamber is $WCl_5$ and $WCl_6$ which has a low hardness and prevents $SiCl_xO_y$ from scaling off the inner wall (quartz) of the process chamber while the wall expands and contracts by temperature hysteresis. Although $SiCl_xO_y$ is not generated during the aging process of this embodiment, it is absolutely generated at the later etching process if silicon-containing material is to be etched vertically because $O_2$ is essential for this process.

In this specification, "without adding oxygen" means without positively introducing oxygen. The background residual gas pressure in the system used by the inventor for experiments was about $1 \times 10^{-6}$ Torr. Although oxygen may be contained partially in this gas, such a small amount of oxygen does not degrade the effects of the aging process.

During the plasma process of a $WSi_2$ layer by $Cl_2$ gas, Si chloride ($SiCl_x$) is also generated as by-products. However, this Si chloride does not contribute to the reduction of particles because it has a high vapor pressure and is exhausted out of the process chamber. On the other hand, W chloride has a relatively low vapor pressure and exists in the form of solid at a room temperature. Therefore, it adheres to the inner wall of the process chamber and becomes a sticking layer providing the particle reducing effects.

From the above consideration, it can be said that the particle reducing effects can be improved more if a wafer with a W layer in place of a $WSi_2$ layer is used as the aging wafer.

Figure 1:
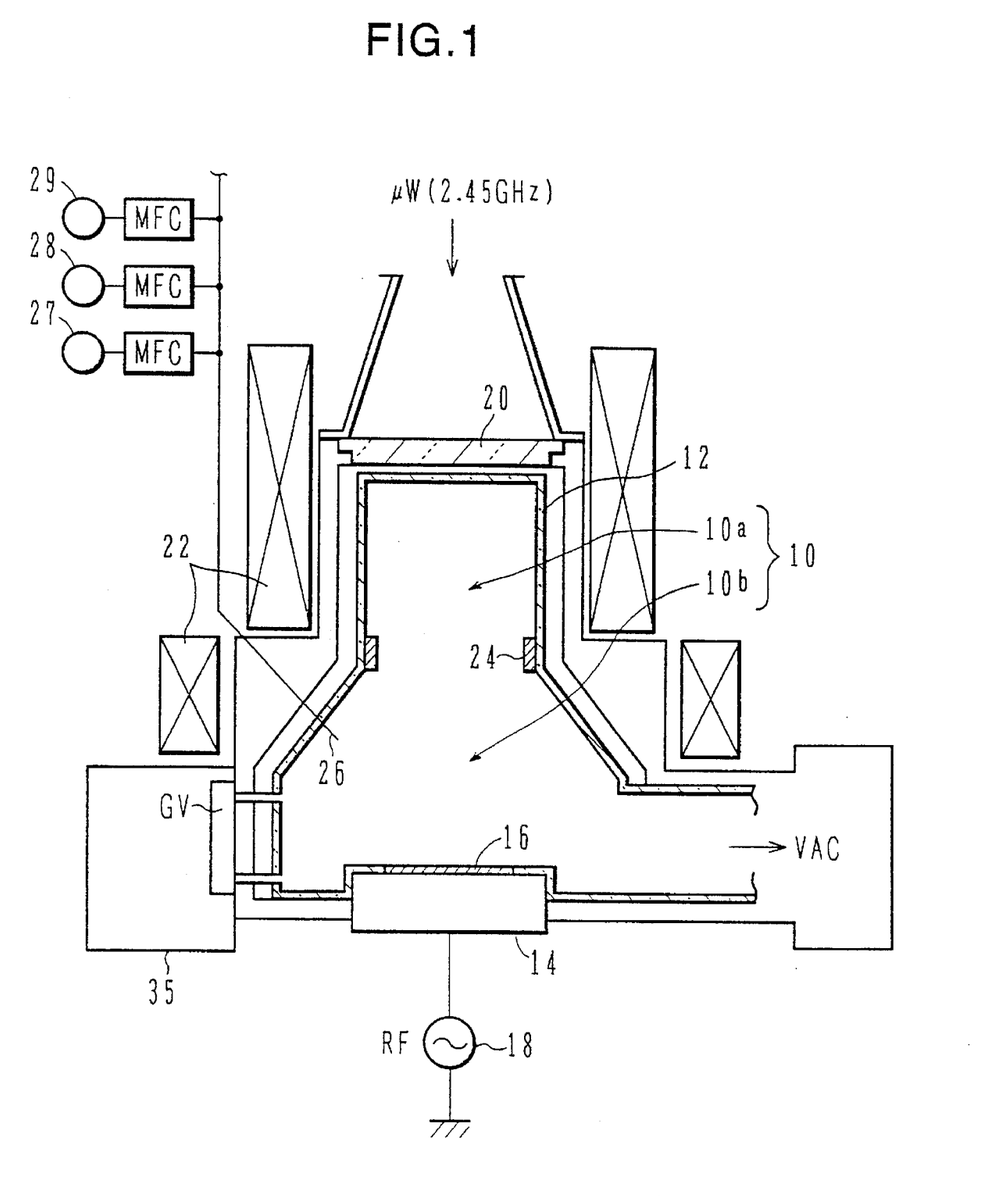
FIG. 1 is a cross sectional view of an ECR plasma etching system according to an embodiment of the invention.

FIG. 1 shows an ECR plasma etching system according to an embodiment of the invention. Like elements to those shown in FIG. 3 are represented by using identical reference numerals, and the description thereof is omitted.

Different points of the system shown in FIG. 1 from that shown in FIG. 3 will be described primarily.

Sticking layer forming material 24 is provided so as to be exposed to plasma, exemplary in a ring shape partially formed on an anti-deposition plate 12 made of quartz and mounted on the inner wall of a process chamber 10. The sticking layer forming material 24 may be W (tungsten), or refractory metal silicide.

Like the system shown in FIG. 3, the process chamber 10 defines a plasma chamber 10a and a reaction chamber 10b. The anti-deposition plate 12 made of quartz is mounted on the inner wall of the process chamber 10.

A susceptor (electrode) 14 is disposed at the bottom of the reaction chamber 10b for placing a wafer 16 thereon. A high frequency power source 18 is connected to the susceptor 14 to supply a high frequency power of, for example, 13.56 MHz. The reaction chamber 10b is connected to gas supply sources 27, 28, and 29 via a pipe 26 and via mass flow controllers MFC, and to a vacuum pump VAC. A wafer store chamber 35 is connected via a gate valve GV to the reaction chamber 10b.

To the upper space of the reaction chamber 10a, a microwave μW of, for example, 2.45 GHz, is supplied from an unrepresented microwave source via a microwave guide window 20 usually made of quartz. A solenoid coil 22 is disposed surrounding the upper portion of the process chamber 10. The conditions for establishing electron cyclotron resonance (ECR) in the process chamber 10 are set up by adjusting the intensity of the magnetic field generated by the solenoid coil 22.

In the etching system shown in FIG. 1, aging is performed by one of the following methods (A) and (B).

Method (A): a wafer 16 of Si formed with a photoresist film is prepared, and it is processed by plasma of halogen containing gas (Cl, Br) (e.g., chlorine) not containing oxygen. During the aging process, by-products formed through reaction with W in the sticking layer forming material 24 and through reaction with photoresist are attached to the inner wall of the process chamber 10 and a sticking layer is formed. At the etching process of Si-containing material after the aging process, the generation of particles can be suppressed.

Method (B): a wafer 16 of Si without a photoresist film is prepared, and it is processed by plasma of mixed gas of halogen containing gas (Cl, Br) (e.g., chlorine) and predetermined additive gas supplied from the pipe 26. The additive gas used is gas which forms by-products similar to those of photoresist. For example, the additive gas may be gas which contains carbon and does not contain F, which is represented by a general formula $C_xH_y$ or $C_xH_yX_z$ (X is Cl or Br). Similar to the method (A), a sticking layer is formed on the inner wall of the process chamber 10 by by-products formed through reaction with W and by-products similar to those of photoresist, providing the particle reducing effects. Instead of the mixed gas, gas containing halogen and carbon and not containing F, such as $CCl_4$ and CBr4, may be used singularly.

In order to obtain the particle reducing effects, mixed gas of carbon and F containing gas such as $CHF_3$ and $CH_2F_2$ and halogen containing gas may also be used. However, this mixed gas is not suitable if an underlying layer of an etched layer, e.g., an $SiO_2$ layer under a gate electrode, is easy to be etched by F radicals and degrades the performance of the device, because F is supplied from the sticking layer on the inner wall of the process chamber and lowers an etching selection ratio of the underlying layer.

In etching Al alloy in batch with a reactive ion etching (RIE) system, it is experimentarily known that even if the number of particles increases temporarily immediately after a wet cleaning process, they can be reduced by etching Al alloy with mixed gas of chlorine containing gas ($Cl_2$, $BCl_3$, $SiCl_4$) and $CHF_3$ gas. This can be ascribed to that particles are caught in a coated film on the inner wall of the reaction chamber, the coated film containing Al chloride ($AlCl_3$: melting point 190° C.), C, F, and so on. This coated film may be used as the sticking layer on the inner wall of a process chamber, for attaching Si oxyhalide.

Whether a coated film attached to the inner wall of the process chamber can be used as the sticking layer which provides the particle reducing effects, depends on the degree of softness, or hardness, of halide contained in the coated film. A melting point of material can be considered as reflecting its hardness. Material having a low melting point is supposed to have a low hardness. It is therefore possible to judge, from a melting point of halide contained in the coated film, whether the coated film can be used effectively as the sticking layer.

A melting point should not be too high or too low. If the melting point is too high, the material has a high hardness and provides an insufficient function as a buffer layer between the inner wall of the process chamber and Si oxyhalide. On the other hand, if the melting point is too low, although the hardness is low, the material has a high vapor pressure at the process temperature, so that it does not attach to the inner wall of the process chamber, or even if it attaches, it is scaled off the inner wall of the process chamber as the temperature in the chamber rises during etching.

The melting points of W chlorides $WCl_5$ and $WCl_6$ of the sticking layer of the embodiment described with FIG. 2 are 248° C. and 275° C., respectively. The melting point of Al chloride AlCl3 generated by the RIE system when Al alloy is etched, is 190° C. It can therefore be considered that halide having a melting point in the range from 190° C. to 275° C. can provide sufficient particle reducing effects.

If material whose halide has a melting point in the range from 190° C. to 275° C. is used as the material to be etched during the aging process, the particle reducing effects can be obtained. However, the material is preferably selected from those used in manufacturing semiconductor devices, since materials degrading the performance of semiconductor devices are not suitable. Proper materials are Al used for wiring materials, refractory metal and refractory metal silicide used for gate electrode materials.

Table 2 shows the melting points of chlorides and bromides of Al and main refractory metals.

TABLE 2

| Chemical Formula | Melting Point (°C.) | Reference Document |
|---|---|---|
| $WCl_5$ | 248 | 1 |
| $WCl_6$ | 275 | 1 |
| $WBr_5$ | 276 | 1 |
| $TaBr_5$ | 221 | 1 |
| $TaBr_5$ | 240 | 1 |
| $NbCl_5$ | 204.74 | 1 |
| $MoCl_5$ | 194 | 1 |
| $AlCl_3$ | 190 | 1 |

Reference document 1: "Chemical Handbook Basics 1", Second revised edition, edited by the Chemical Society of Japan.

Reference document 2: "Materials Processing Theory and Practices", Volume 4, "dry etching for microelectronics", North-Holland Physics Publishing.

As seen from Table 2, W, Ta, Nb, Mo, silicide of these metals, Al, Al alloy, and so on can be used as the materials to be etched during the aging process. These materials can be used also as the sticking layer forming material partially formed on the inner wall of the process chamber. As the material to be etched during the aging process, materials whose chloride or bromide has a melting point in the range from 190° C. to 300° C. may also be usable.

Aging gases usable for the sticking layer forming material to be deposited on a wafer during the aging process are exemplary shown in Table 3. In Table 3, additive gases usable for either a wafer with a resist pattern or a wafer without a resist pattern are also shown. The expected main compositions of a sticking layer are also shown for each gas.

TABLE 3

| Aging/Wafer | | Aging Gas | | |
| --- | --- | --- | --- | --- |
| Material of Sticked Layer | Resist Pattern | Halogen Containing Gas | Additive Gas | Expected Main Compositions of Sticked Layer |
| $WSi_2$ W | Present | one of $Cl_2$, HCl, | None | $WCl_5$, $WCl_6$, $C_xH_y$ (resist component) |
| | None | $Cl_2$ + HCl, $Cl_2$ + $BCl_3$ | $C_xH_y$ | $WCl_5$, $WCl_6$, $C_xH_y$ (akin to resist component) |
| | | | $C_xH_yCl_z$ | $WCl_5$, $WCl_6$, $C_xH_yCl_2$ (akin to resist component) |
| | | | $C_xH_yBrz_2$ | $WCl_5$, $WCl_6$, $C_xH_yBr_z$ (akin to resist component) |
| | Present | one of $Br_2$, HBr, | None | $WBr_5$, $C_xH_y$ (resist component) |
| | None | $Br_2$ + HBr, $Br_2$ + $BBR_3$ | $C_xH_y$ | $WBr_5$, $C_xH_y$ (akin to resist) component) |
| | | | $C_xH_yCl_z$ | $WBr_5$, $C_xH_yCl_z$ (akin to resist component) |
| | | | $C_xH_yBr_z$ | $WBr_5$, $C_xH_yBr_z$ (akin to resist component) |
| | Present | one of $Cl_2$ + HBr, $Br_2$ + HCl | None | $WCl_5$, $WCl_6$, $WBr_5$, $C_xH_y$ (resist component) |
| | None | | $C_xH_y$ | $WCl_5$, $WCl_6$, $WBr_5$, $C_xH_y$ (akin to resist component) |
| | | | $C_xH_yCl_z$ | $WCl_5$, $WCl_6$, $WBr_5$, $C_xH_yCl_z$ (akin to resist component) |
| | | | $C_xH_yBr_z$ | $WCl_5$, $WCl_6$, $WBr_5$, $C_xH_yBr_z$ (akin to resist component) |
| $MoSi_2$ Mo | Present | one of $Cl_2$, HCL, | None | $MoC15$, $C_xH_y$ (resist component) |
| | None | $Cl_2$ + HCl, $Cl_2$ + $BCl_3$ | $C_xH_y$ | $MoCl_5$, $C_xH_y$ (akin to resist component) |
| | | | $C_xHyCl_2$ | $MoCl_5$, $C_xH_yCl_z$ (akin to resist component) |
| | | | $C_xH_yBr_z$ | $MoI_5$, $C_xH_yBr_z$ (akin to resist component) |
| $TaSi_2$ Ta | Present | one of $Cl_2$, HCL, | None | $TaCl_5$, $C_xH_y$ (resist component) |
| | None | $Cl_2$ + HCl, $Cl_2$ + $BCl_3$ | $C_xH_y$ | $TaCl_5$, $C_xH_y$ (akin to resist component) |
| | | | $C_xH_yCl_z$ | $TaCl_5$, $C_xH_yCl_z$ (akin to resist component) |

TABLE 3-continued

| Aging/Wafer | | Aging Gas | | |
| --- | --- | --- | --- | --- |
| Material of Sticked Layer | Resist Pattern | Halogen Containing Gas | Additive Gas | Expected Main Compositions of Sticked Layer |
| | | | $C_xH_yBr_z$ | $TaCl_5$, $C_xH_yBrz$ (akin to resist component) |
| | Present | one of $Br_2$, HBr, | None | $TaBr5$, $C_xH_y$ (resist component) |
| | None | $Br_2$ + HBr, $Br_2$ + $BBr_3$ | | $TaBr5$, $C_xH_y$ (akin to resist component) |
| | | | $C_xH_yCl_z$ | $TaBr_5$, $C_xH_yCl_z$ (akin to resist component) |
| | | | $C_xH_yBr_z$ | $TaBr_5$, $C_xH_yBr_z$ (akin to resist component) |
| | Present | one of $Cl_2$ + HBr, $Br_2$ + HCl | None | $TaCl_5$, $TaBr_5$, $C_xH_y$ (resist component) |
| | None | | $C_xH_y$ | $TaCl_5$, $TaBr_5$, $C_xH_y$ (akin to resist component) |
| | | | $C_xH_yCl_z$ | $TaCl_5$, $TaBr_5$, $C_xH_yCl_z$ (akin to resist component) |
| | | | $C_xH_yBr_z$ | $TaCl_5$, $TaBr_5$, $C_xH_yBr_z$ (akin to resist component) |
| $NbSi_2$ Nb | Present | one of $Cl_2$, HCl, | None | $NbCl_5$, $C_xH_y$ (resist component) |
| | None | $Cl_2$ + HCl, $Cl_2$ + $BCl_3$ | $C_xH_y$ | $NbCl_5$, $C_xH_y$ (akin to resist component) |
| | | | $C_xH_yCl_z$ | $NbCl_5$, $C_xH_yCl_z$ (akin to resist component) |
| | | | $C_xH_yBr_z$ | $NbCl_5$, $C_xH_yBr_z$ (akin to resist component) |
| Al Al alloy | Present | $BCl_3$ + $Cl_2$ | None | $AlCl_3$, $C_xH_y$ (resist component) |
| | None | | $C_xH_y$ | $AlCl_3$, $C_xH_y$ (akin to resist component) |
| | | | $C_xH_yCl$ | $AlCl_3$, $C_xH_yCl_z$ (akin to resist component) |
| | | | $C_xH_yBr_z$ | $AlCl_3$, $C_xH_yBr_z$ (akin to resist component) |

In addition to the combinations of aging gases shown in Table 3, one of $Cl_2$, $Br_2$, HCl, $BCl_3$, HBr, and BBr3, and combinations of a plurality of these gases may be used. However, only Cl containing gases are effective for forming the sticking layer in the case of Mo, $MoSi_2$, Nb, $NbSi_2$, Al, and Al alloy, whereas both Cl containing gas and Br containing gas are effective for forming the sticking layer in the case of W, $WSi_2$, Ta, and $TaSi_2$.

The invention is not limited only to the above embodiments. For example, in the aging process using a wafer, instead of a wafer provided with a sticking layer forming material layer and a resist pattern stacked thereon, a wafer formed with a sticking layer forming material layer and a wafer formed with a resist pattern may be used separately.

Furthermore, this invention is applicable not only to the ECR plasma etching system shown in FIG. 1 but also to the microwave plasma etching system shown in FIG. 4. In the latter case, instead of using a wafer with a sticking layer forming material layer, the aging process may be performed by partially forming a sticking layer forming material 24 on the inner wall of the process chamber 30.

It is apparent to those skilled in the art that various modifications, improvements, combinations and the like can be made without departing from the scope of the appended claims.

What is claimed is:

1. A dry etching method comprising the steps of:
   performing an aging process with an aging wafer including a silicon-containing material by plasma of an aging gas not containing oxygen in a process chamber, thereby forming a sticking layer on an inner wall of the process chamber, said sticking layer having a hardness lower than the material of the inner wall and silicon oxyhalide; and
   thereafter performing an etching process on another wafer including a silicon-containing material by plasma of an etching gas containing halogen and oxygen in the process chamber.

2. A dry etching method according to claim 1, wherein said aging gas contains a halogen-containing gas, said aging wafer includes a refractory metal or compound thereof, and said sticking layer contains by-products formed through reaction of halogen containing gas with refractory metal or its compound and with resist.

3. A dry etching method according to claim 2, wherein said refractory metal is at least one kind of metal selected from the group consisting of W, Mo, Ta, and Nb.

4. A dry etching method according to claim 2, wherein said halogen containing gas is at least one kind of gas selected from the group consisting of $Cl_2$, $Br_2$, HCl, HBr, $BCl_3$, and $BBr_3$.

5. A dry etching method according to claim 1, wherein said aging gas contains a halogen-containing gas, said aging wafer includes aluminum or an aluminum alloy, and said sticking layer contains by-products formed through reaction of halogen containing gas with aluminum or aluminum alloy.

6. A dry etching method according to claim 5, wherein said halogen containing gas is at least one kind of gas selected from the group consisting of $Cl_2$, and $BCl_3$.

7. A dry etching method according to claim 1, wherein said inner wall of the process chamber is formed of quartz.

8. A dry etching method according to claim 1, wherein said sticking layer contains halide having a melting point in the range from 190° C. to 300° C.

9. A dry etching method according to claim 1, wherein said sticking layer contains halide having a melting point in the range from 190° C. to 276° C.

10. A dry etching method according to claim 1, wherein said sticking layer contains halide having a melting point in the range from 190° C. to 275° C.

11. A dry etching method according to claim 1, wherein said sticking layer contains at least one composition selected from the group consisting of $WCl_5$, $WCl_6$, $WBr_5$, $MoCl_5$, $TaCl_5$, $TaBr_5$, $NbCl_5$, and $AlCl_3$ and at least one composition selected from the group consisting of $C_xH_y$, $C_xH_yCl_z$, and $C_xH_yBr_z$ where x, y, and z are a positive integer.

12. A method for dry etching in a chamber, comprising the steps of:
   (a) providing an aging instrument having a source layer;
   (b) introducing an aging gas into the chamber; and
   (c) aging in the chamber without introducing oxygen into the chamber so as to provide a sticking layer having a hardness lower than the material of an inner wall of the chamber and silicon oxyhalide, wherein the sticking layer being generated from the source layer and the aging gas.

13. A method according to claim 12, wherein the aging gas contains a halogen-containing gas, and said source layer includes a refractory metal or compound thereof.

14. A method according to claim 13, wherein the refractory metal comprises a material selected from a group consisting of W, Mo, Ta and Nb.

15. A method according to claim 13 wherein the halogen-containing gas comprises a material selected from a group consisting of $Cl_2$, $Br_2$, HCl, HBr, $BCl_3$ and $BBr_3$.

16. A method according to claim 12, wherein the aging gas contains a halogen-containing gas, and said source layer includes aluminum or aluminum alloy.

17. A method according to claim 16, wherein the halogen containing gas comprises a material selected from a group consisting of $Cl_2$ and $BCl_3$.

18. A method according to claim 12, wherein the inner wall of the chamber is made of quartz.

19. A method according to claim 12, wherein the sticking layer includes at least one composition selected from the group consisting of $WCl_5$, $WCl_6$, $WBr_5$, $MoCl_5$, $TaCl_5$, $TaBr_5$, $NbCl_5$ and $AlCl_3$.

20. A method according to claim 12, wherein the aging instrument is a silicon wafer.

21. A dry etching system comprising:
   a process chamber provided with a sticking layer forming metal at least partially on the inner wall thereof for forming a sticking layer by plasma of an aging gas containing a halogen with an additive gas containing carbon or by plasma of said aging gas with a resist, said sticking layer having a hardness lower than the material of the inner wall and silicon oxyhalide, and said process chamber being used for etching silicon-containing material by plasma;
   means for supplying said aging gas alone, said aging gas with said additive gas or an etchant gas to said chamber; and
   means for supporting an aging wafer optionally including said resist or a wafer to be etched.

22. A dry etching system according to claim 21, wherein said sticking layer forming metal is refractory metal or its compound.

23. A dry etching system according to claim 22, wherein said refractory metal is at least one kind selected from the group consisting of W, Mo, Ta, and Nb.

24. A dry etching system according to claim 21, wherein said sticking layer forming metal is aluminum or aluminum alloy.

25. A dry etching system comprising:

a plasma process chamber having an inner wall; and a film formed on the inner wall, said film being made of sticking material having a melting point in the range from 190° C. to 300° C., wherein said sticking layer contains at least one composition selected from the group consisting of $WCl_5$, $WCl_6$, $WBr_5$, $MoCl_5$, $TaCl_5$, $TaBr_5$, $NbCl_5$, and $AlCl_3$ and at least one composition selected from the group consisting of $C_xH_y$, $C_xH_yCl_2$, and $C_xH_yBr_x$ where x, y, and z are a positive integer.

26. A dry etching system according to claim 25, wherein said sticking material has a melting point in the range from 190° C. to 276° C.

* * * * *